(12) United States Patent
Komatsu et al.

(10) Patent No.: US 11,084,385 B2
(45) Date of Patent: Aug. 10, 2021

(54) BATTERY CONTROL DEVICE, BATTERY SYSTEM, AND VEHICLE

(71) Applicant: VEHICLE ENERGY JAPAN INC., Hitachinaka (JP)

(72) Inventors: Daiki Komatsu, Tokyo (JP); Kei Sakabe, Tokyo (JP); Masahiro Yonemoto, Tokyo (JP); Shin Yamauchi, Tokyo (JP); Keiichiro Ohkawa, Hitachinaka (JP); Ryohhei Nakao, Hitachinaka (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 241 days.

(21) Appl. No.: 16/328,953

(22) PCT Filed: Jul. 28, 2017

(86) PCT No.: PCT/JP2017/027361
§ 371 (c)(1),
(2) Date: Feb. 27, 2019

(87) PCT Pub. No.: WO2018/061449
PCT Pub. Date: Apr. 5, 2018

(65) Prior Publication Data
US 2019/0242948 A1    Aug. 8, 2019

(30) Foreign Application Priority Data

Sep. 30, 2016 (JP) .............................. JP2016-192515

(51) Int. Cl.
*B60L 50/64* (2019.01)
*H02J 7/00* (2006.01)
(Continued)

(52) U.S. Cl.
CPC ................. *B60L 50/64* (2019.02); *B60K 6/28* (2013.01); *B60L 50/16* (2019.02); *B60L 58/16* (2019.02);
(Continued)

(58) Field of Classification Search
CPC ............................ B60L 50/64; H02J 7/00302
(Continued)

(56) References Cited

U.S. PATENT DOCUMENTS

2010/0079111 A1\* 4/2010 Masuda ............ H02J 7/007194
320/134
2014/0111164 A1    4/2014 Ohkawa et al.
(Continued)

FOREIGN PATENT DOCUMENTS

| JP | 2012-054019 A | 3/2012 |
| JP | 2013-178202 A | 9/2013 |
| WO | WO-2012/169063 A1 | 12/2012 |

OTHER PUBLICATIONS

International Search Report with English translation issued in corresponding application No. PCT/JP2017/027361 dated Sep. 12, 2017.

*Primary Examiner* — Suchin Parihar
(74) *Attorney, Agent, or Firm* — Foley & Lardner LLP

(57) ABSTRACT

In an existing permissible current computation algorithm, an excessive current is caused to flow by controlling the battery having a steep change region in the battery characteristic. On the other hand, when the current is reduced and the output is suppressed, the battery performance cannot be sufficiently utilized. Moreover, with countermeasures to increase the number of data points, the amount of data increases and thus can not be installed in the microcomputer. A battery control device that computes a permissible current of a battery having a battery characteristic non-steep change region having a small battery characteristic change and a battery
(Continued)

characteristic steep change region having a battery characteristic change greater than in the battery characteristic non-steep change region, in which in a case where the battery enters the battery characteristic steep change region after a predetermined time from a present state, a battery characteristic value is calculated by using an absolute value of a slope greater than an absolute value of a slope in the present battery characteristic.

12 Claims, 8 Drawing Sheets

(51) Int. Cl.

| | |
|---|---|
| B60W 20/13 | (2016.01) |
| B60W 10/26 | (2006.01) |
| B60L 50/16 | (2019.01) |
| H01M 10/48 | (2006.01) |
| B60K 6/28 | (2007.10) |
| B60W 20/11 | (2016.01) |
| G01R 31/367 | (2019.01) |
| B60L 58/16 | (2019.01) |

(52) U.S. Cl.
CPC ............ *B60W 10/26* (2013.01); *B60W 20/11* (2016.01); *B60W 20/13* (2016.01); *G01R 31/367* (2019.01); *H01M 10/48* (2013.01); *H02J 7/00* (2013.01); *H02J 7/0031* (2013.01); *H02J 7/00302* (2020.01); *Y02T 10/70* (2013.01); *Y02T 10/7072* (2013.01)

(58) Field of Classification Search
USPC ........................................................ 320/134
See application file for complete search history.

(56) References Cited

U.S. PATENT DOCUMENTS

| | | | |
|---|---|---|---|
| 2019/0004120 A1* | 1/2019 | Swan | G01R 31/389 |
| 2020/0164885 A1* | 5/2020 | Kujubu | B60W 10/188 |
| 2020/0298727 A1* | 9/2020 | Ukai | B60W 60/0051 |
| 2020/0393518 A1* | 12/2020 | Takegami | H02J 7/007182 |

* cited by examiner

BATTERY CONTROL DEVICE, BATTERY SYSTEM, AND VEHICLE

TECHNICAL FIELD

The present invention relates to a battery control device using a lithium ion battery or the like, a battery system and a vehicle, and more particularly to a method of calculating a current limit value.

BACKGROUND ART

In recent years, batteries capable of effectively utilizing energy are receiving attention in view of managing the global warming problem. In particular, battery systems such as power storage devices for mobile application and power storage devices for grid interconnection stabilization are expected to expand more because of their capability of lowering the dependence on fossil fuels. In order to optimize the performance of these systems, there is a need to perform appropriate charge/discharge control using parameters such as State of Charge (hereinafter, abbreviated as SOC) and State of Health (hereinafter referred to as SOH) of the batteries, and maximum chargeable/dischargeable current (permissible current), and equalization of the charge rate in each of the batteries. In order to achieve these, each of the batteries is provided with circuits (cell controllers) for battery voltage measurement, and a battery controller equipped with a central processing unit (CPU) performs the computation and operation on the basis of information transmitted from these cell controllers.

Among these, the permissible current computation is part of safety functions for preventing degradation due to overvoltage and abnormal reaction in the battery, and thus needs to output a sufficiently small current so as not to cause these problems. On the other hand, however, outputting an excessively small current value for safety control would lead to excessively limiting the output of the battery, impairing the advantage of using the battery. In order to compute a permissible current that can achieve both safety and high output, it is desirable to calculate the maximum possible current value that would not induce overvoltage of the battery.

In order to compute the maximum current that would not induce overvoltage of the battery, it is necessary to use an internal state and parameters of the battery such as open circuit voltage (hereinafter, abbreviated as OCV) of the battery and internal resistance information. It is also important to predict a battery state after application of the current in consideration of the time of application of the maximum current. In particular, since the SOC fluctuates in a short time in the power storage device for mobile application required to perform abrupt input/output operation, it is necessary to correct the battery parameter in accordance with a predicted slope of the OCV along a change in SOC and predict the battery state. In a case however, where there is a steep change region in which the OCV changes steeply at a certain SOC, this prediction would be difficult.

PTL 1 is a known technology related to permissible current computation. In PTL 1, a permissible current is computed from the internal resistance at the X seconds after a certain time, upper and lower limit voltages, and the present OCV after application of the current. Meanwhile, since control of a battery having a steep change region is not targeted, the same permissible current computation processing is performed in an entire SOC region. In order to control a battery having a steep change region while achieving both safety and high output, however, construction of control in consideration of these would be indispensable.

CITATION LIST

Patent Literatures

PTL 1: WO 2012/169063

SUMMARY OF INVENTION

Technical Problem

While the permissible current computation method computes a permissible current from the present battery state or in consideration of a fixed resistance value, this method performs no control using prediction of OCV after a certain time in consideration of a region in which the OCV has a steep change in accordance with the SOC, such as an inflection point of a SOC-OCV curve of the battery. Therefore, it is necessary to provide a margin for computing the permissible current to be a value small enough to suppress outputting an excessive current even when an error occurs in the OCV estimation after passage of a certain time in the vicinity of the steep change region such as an inflection point. Providing such a margin leads to computation of the permissible current to be a small value even in a region where there is no error in the OCV estimation, which might excessively limit the output of the battery. Therefore, in order to achieve both safety and high output, there is a need to perform permissible current computation that corresponds to the steep region.

Solution to Problem

A battery control device that computes a permissible current of a battery having a battery characteristic non-steep change region having a small battery characteristic change and a battery characteristic steep change region having a battery characteristic change greater than in the battery characteristic non-steep change region, in which in a case where the battery enters the battery characteristic steep change region after a predetermined time from a present state, a battery characteristic value is calculated by using an absolute value of a slope greater than an absolute value of a slope in the present battery characteristic.

Advantageous Effects of Invention

According to the present invention, even when the battery has an inflection point and a steep change region in a SOC-OCV curve, it is possible to appropriately predict battery information after application of the permissible current without increasing the amount of data to be mounted, leading to achievement of control in the safe direction. Moreover, since there is no need to increase the amount of data unnecessarily, it is possible to mount the battery even in a system with data capacity limitation.

DESCRIPTION OF EMBODIMENTS

Hereinafter, first to fifth exemplary embodiments will be described below with reference to FIGS. 1 to 8.

First Exemplary Embodiment

Figure 1:
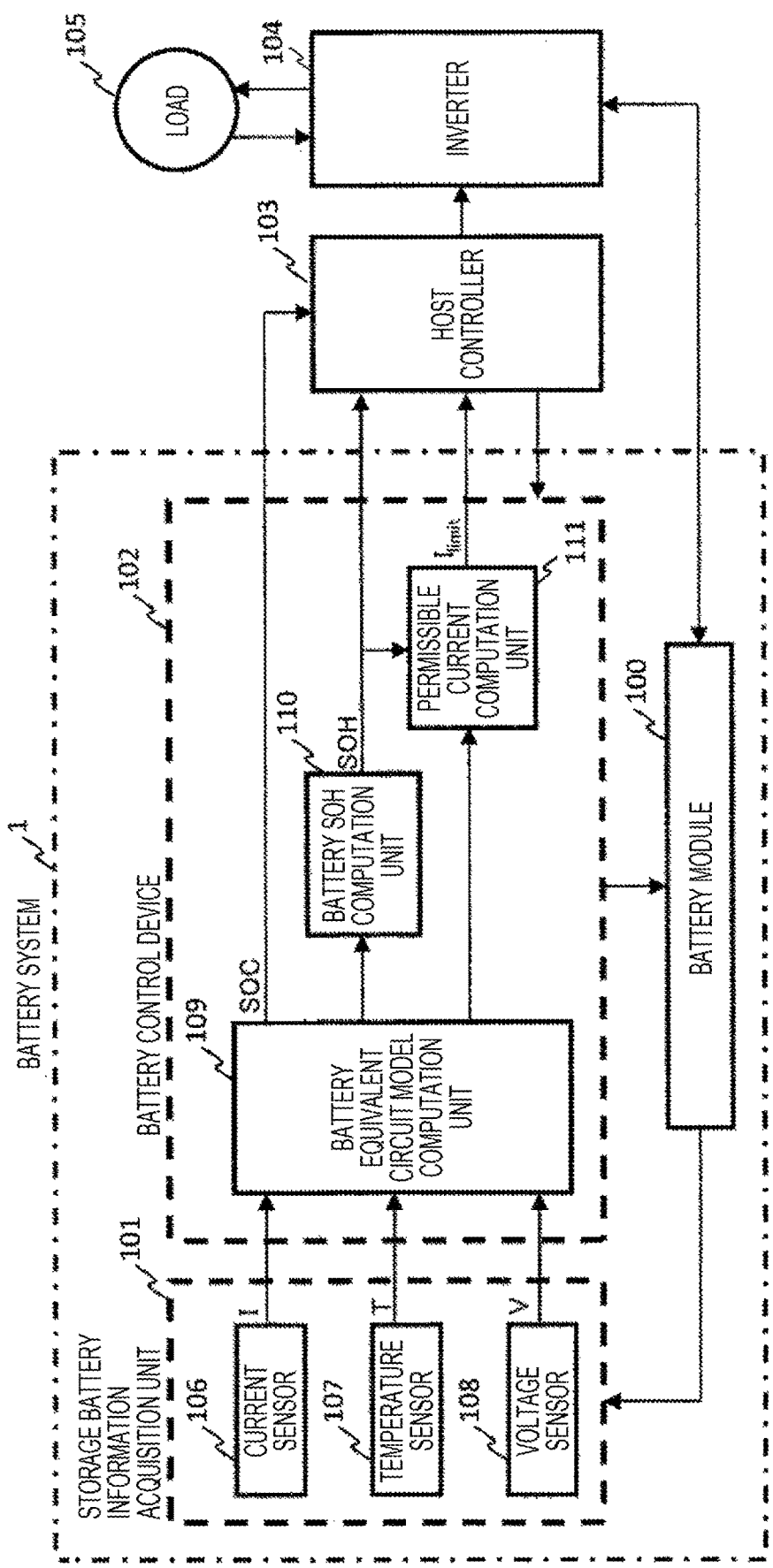
FIG. 1 is a configuration example of a battery system.

The first exemplary embodiment will be described below. FIG. 1 illustrates a battery system according to the present invention. This configuration is used in a wide range of applications such as power storage devices for mobile application and a power storage device for grid interconnection stabilization. This configuration includes a battery system 1 that stores power, an inverter 104 that performs charging/discharging of the battery system 1, a load 105 connected to the inverter, and a host controller 103 that controls the battery system 1 and the inverter 104.

The battery system 1 performs power charge/discharge and battery control value computation of SOC and permissible current being control values necessary for the power charge/discharge. The host controller 103 performs control of a battery module 100 and power input/output instruction to the inverter 104 in accordance with the state of the load 105, the control value of the battery output by the battery system 1, and other external instructions. In accordance with an instruction from the host controller 103, the inverter 104 performs power input/output to the battery module 100 and the load 105. The load 105 is a three-phase AC motor or a utility grid, for example.

The voltage output from the battery module 100 is a DC voltage that varies in accordance with the State of Charge, and in most cases it is not possible to directly supply power to the load 105 that needs AC. Therefore, the inverter 104 performs conversion from DC power to AC power, or voltage transformation as necessary. With such a configuration, the battery system can appropriately supply an output suitable for the load. Hereinafter, a configuration of the battery system 1 for implementing this configuration will be described.

The battery system 1 includes the battery module 100, a battery information acquisition unit 101, and a battery control device 102. The battery system 1 performs power charge/discharge and computes battery control values such as SOC and a permissible current.

The battery module 100 includes a plurality of batteries. Each of the batteries is connected in series or in parallel in accordance with the output voltage and capacity needed by the battery module 100. The number of connections in series is determined in view of change in battery output voltage with its SOC.

The battery information acquisition unit 101 includes a current sensor 106 that measures a current value flowing in the battery, a temperature sensor 107 that measures a battery surface temperature, and a voltage sensor 108 that measures a battery voltage.

There are cases where one or more current sensors 107 are installed between the battery module 100 and the outside. In a case where one current sensor 107 is installed, it is possible to minimize the cost. In a case where the plurality of current sensors 107 is installed, it is possible to grasp the current distribution between the batteries connected in parallel.

The voltage sensor 108 is installed for each of batteries, one for each. This makes it possible to measure the voltage difference between the batteries, enabling equalization control of each of battery voltages based on a result of this measurement.

One or more temperature sensors 107 are also installed in order to grasp the temperature difference inside the battery module 100. In a case where one temperature sensor 107 is installed, it is possible to measure the temperature of a point at which the maximum temperature is predictable in the battery module 100 at the minimum cost. In a case where the plurality of temperature sensors 107 is installed, it is possible to measure the temperature variation in the battery module 100 so as to achieve control in consideration of the minimum temperature and the maximum temperature.

The battery control device 102 mainly includes a battery equivalent circuit model computation unit 109, a battery SOH computation unit 110, and a permissible current computation unit 111. The battery equivalent circuit model computation unit 109 calculates battery internal information such as the influence of SOC, OCV, polarization, etc. from the information of current, temperature, and voltage, output from the battery information acquisition unit 101. The battery SOH computation unit 110 computes SOH, which is the state of health (degradation degree) of the battery, on the basis of this information. The permissible current computation unit 111 computes a permissible current being the maximum chargeable/dischargeable current on the basis of the SOH and the internal information of the battery. The battery control device 102 outputs the battery internal state, SOH, and the permissible current computed by the battery equivalent circuit model computation unit 109, the battery SOH computation unit 110, and the permissible current computation unit 111, to the host controller. Adopting the configuration of outputting information necessary for battery control to the host controller 103 in this manner enables the host controller 103 to send a power output instruction corresponding to the load, to the battery in consideration of the battery state.

Figure 2:
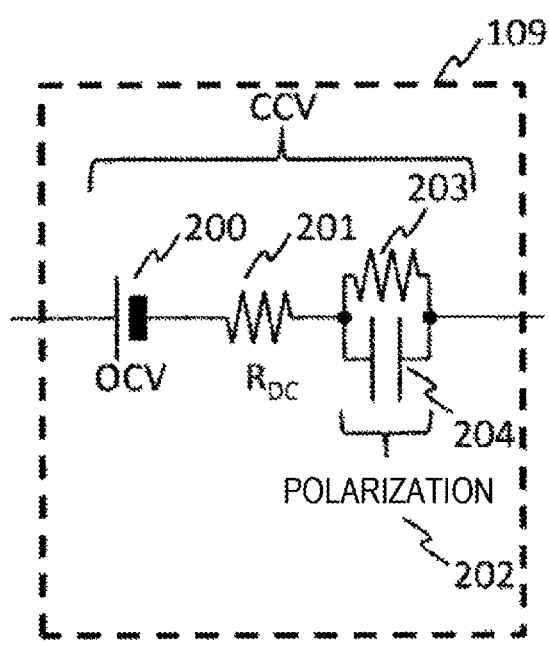
FIG. 2 is an example of a battery model.

The battery equivalent circuit model computation unit 109 computes the internal state of the battery such as the SOC by using the equivalent circuit of the battery. FIG. 2 illustrates a configuration of the battery equivalent circuit model used for computation. In the battery equivalent circuit model used in the present exemplary embodiment, the OCV is represented by a voltage source 200, a DC resistance expressing the resistance or the like of the electrolytic solution is represented by a resistor 201, a resistive component of a polarized portion 202, derived from concentration polarization of ions in an electrolytic solution, is represented by the resistor 203, and the polarized capacity component is represented by the capacitor 204, and the present voltage of the battery (Closed Circuit Voltage (CCV)) will be represented by summation of these components. While the present exemplary embodiment uses one polarization term, a plurality of polarization terms may be used to achieve higher accuracy. Utilization of this equivalent circuit model makes it possible to compute the SOC and OCV of the battery, polarization voltage, resistance of each of portions, etc. at present on the basis of battery information such as the current value, the voltage value, and the temperature measured by the battery information acquisition unit 101 described above. With calculation of these, it is possible to separate the battery voltage value being information obtained by adding the total information such as polarization and possible to indirectly obtain the internal state of the present battery difficult to measure directly.

Figure 3:
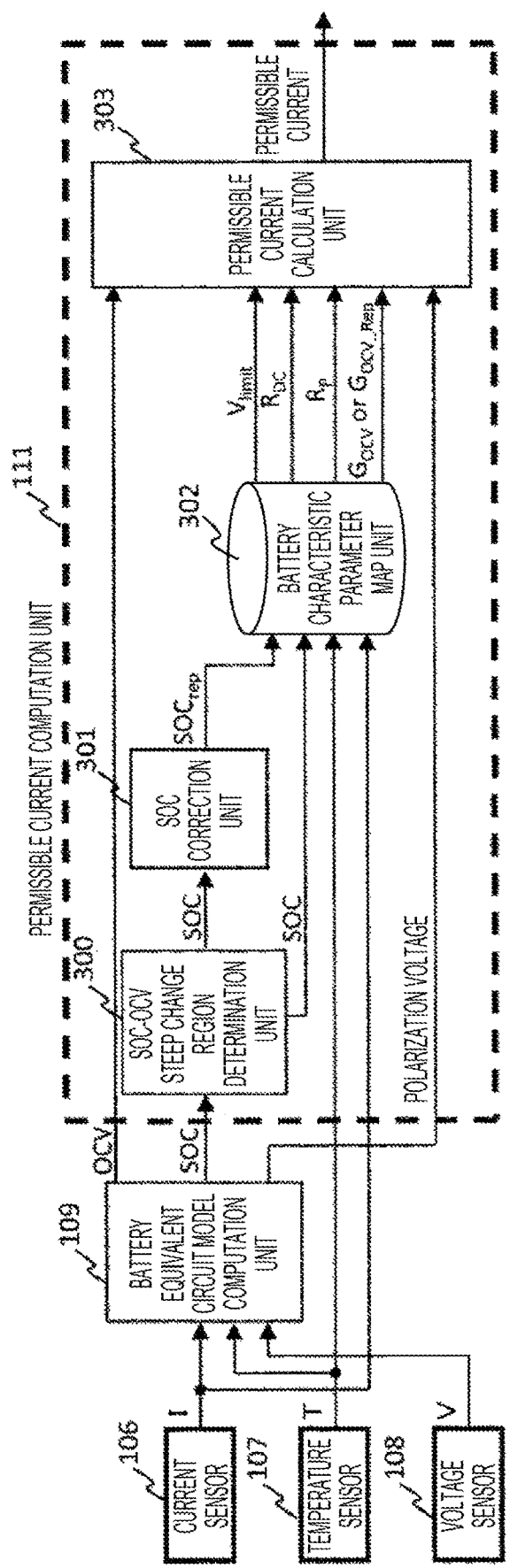
FIG. 3 is an example of permissible current computation unit corresponding to a steep change region of OCV.

Next, the configuration of the permissible current computation unit 111 is illustrated in FIG. 3. A purpose of the permissible current computation unit 111 is to calculate a permissible current which is the maximum chargeable/dischargeable current. The maximum chargeable/dischargeable current is the maximum current that suppresses the CCV at application of current from reaching upper and lower limit voltages set to prevent battery deterioration and uncontrollable operation. In the present exemplary embodiment, computation is performed such that the voltage after n seconds of current application would not exceed the upper limit voltage 4.2V and the lower limit voltage 2.8V. The permissible current computation unit 111 includes an SOC-OCV steep change region determination unit 300, an SOC correction unit 301, a battery characteristic parameter map unit 302, and a permissible current calculation unit 303.

In order to compute the permissible current, it is necessary to consider the characteristics of the battery with respect to SOC, for example, the relationship between SOC and OCV. Therefore, at the time of computation, the value of OCV in a certain SOC is obtained by using a parameter map in which the relationship between SOC and OCV is discretely mapped. The conversion from the discrete value to the continuous value is performed by linear interpolation, for example. This makes it possible to refer to the relationship between the individual characteristics of the battery with a small amount of data.

Figure 4:
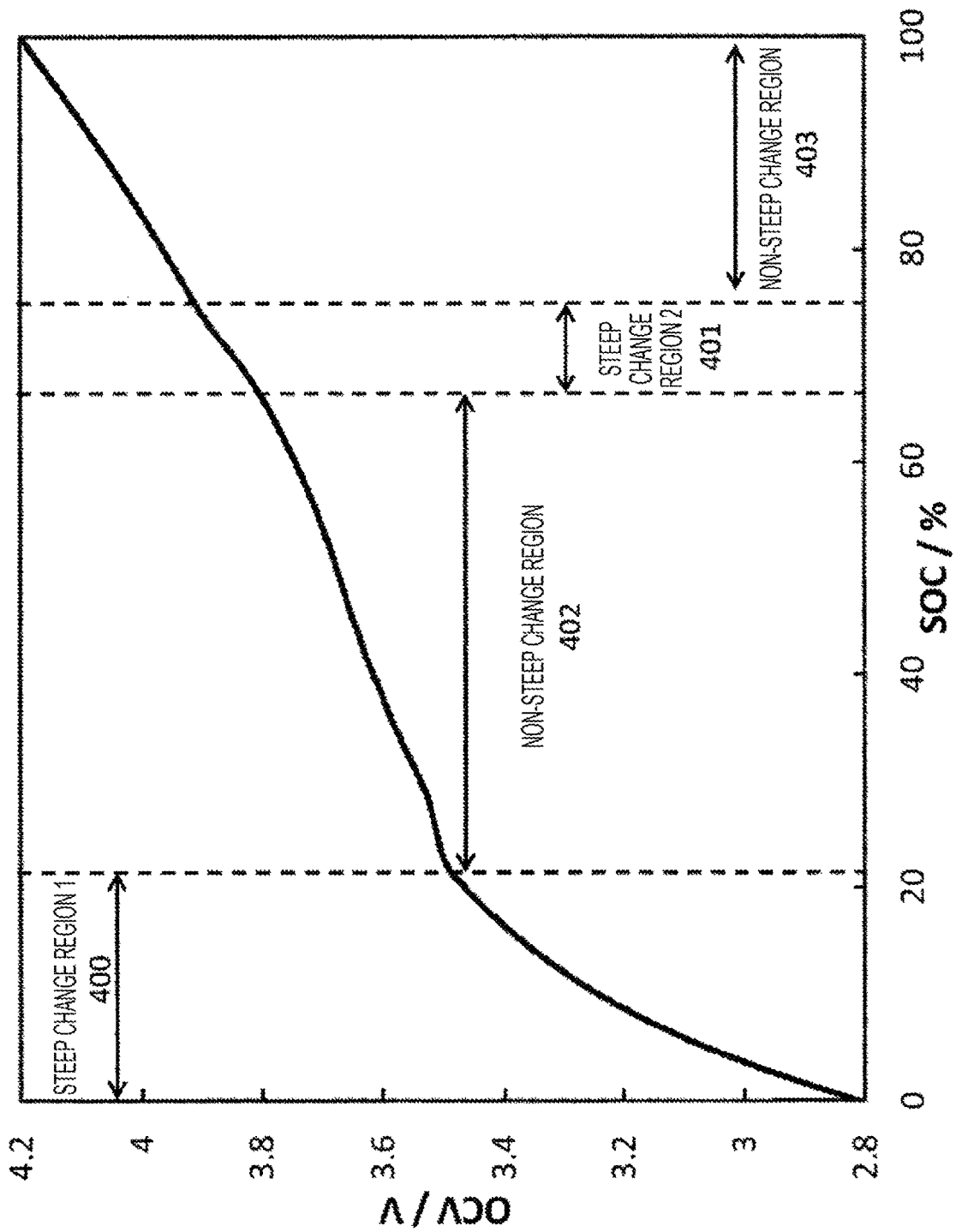
FIG. 4 is a SOC-OCV curve of a battery having a steep change region.

However, a certain battery has a region in which the battery state steeply changes with respect to the SOC. As an example of this steep change region, the reaction energy of the electrode of the battery varies depending on the SOC range due to the step structure of the graphite insertion/insertion reaction, or the like, so that the OCV deviates from the linear behavior with respect to the SOC. Therefore, for example, in the case of a battery having an SOC-OCV curve as illustrated in FIG. 4, the OCV is obtained by using the representative value of the OCV slope in the steep change regions 400 and 401, while another type of processing is performed without using the representative value of the OCV slope in regions other than the steep change region, that is, in non-steep change regions 402 and 403. The steep change region is a region in which the slope of the OCV for every SOC 1% is inclined by 1 mV/% or more between individual portions of SOC 1%. The definition of this region is determined by a target accuracy of the permissible current as appropriate.

The permissible current computation unit 111 always uses, in the vicinity of the steep change region, the maximum value of the slope of the OCV within that range as the slope of the OCV so as to control not to exceed the upper and lower limit voltages. In the present exemplary embodiment, the vicinity of the steep change region is defined as an entire data range that includes a steep change region. For example, in a case where the battery characteristic parameter map unit 302 contains the OCV as a parameter map for every SOC 10%, the vicinity of the steep change region is a range of 10% between data to which the steep change region belongs. Note that this battery characteristic parameter map unit 302 can use a storage device that functions as a storage unit, such as a RAM.

The SOC-OCV steep change region determination unit 300 determines whether processing of suppressing the voltage to the level that does not exceed the upper and lower limit voltages is necessary in a case where there is this steep change region between the data points predetermined in the battery characteristic parameter map unit 302. Specifically, information related to the predetermined steep change regions 400 and 401 is compared with the SOC information of the present battery so as to determine whether the region needs correction. In a case where the correction processing is unnecessary, the SOC information output by the battery equivalent circuit model computation unit 109 is output to the battery characteristic parameter map unit 302, and in a case where the region needs correction, the SOC information is output to the SOC correction unit 301.

The SOC correction unit 301 corrects the input SOC information to a SOC representative value referring to the slope representative value of the OCV stored in the battery characteristic parameter map unit 302, and outputs the corrected value to the battery characteristic parameter map unit 302. The slope representative value of this OCV is set as the maximum value of the slope of OCV in the steep change region. With this configuration, it is possible to perform permissible current computation that achieves both safety and high output even in the vicinity of the steep change region.

The battery characteristic parameter map unit 302 outputs upper and lower limit voltages, a DC resistance value, polarization term, and the slope of OCV corresponding to SOC information, temperature, and the current value. These data items are stored as map data. In a case where the value input to the battery characteristic parameter map unit 302 is a value on a grid point of the map data, a reference value of the map data is output as it is. In a case where the input value is a value between the grid points of the map data, the upper limit voltage, the DC resistance, the polarization resistance, and the slope of the OCV are calculated from the individual values by interpolation processing between the map data. Regarding the slope of the OCV, in a case where the SOC representative value has been input, the OCV is computed by using this, that is, with reference to the OCV slope representative value corresponding to the SOC representative value. In this manner, by dividing processing into processing for the steep change regions 400 and 401 and processing for the other regions (non-steep change regions 402 and 403), it is possible to perform control achieving both safety and high output, and it is possible, in the other cases, to maintain high output performance similar to normal processing even in a case where the battery enters the steep change region of the battery characteristic after a predetermined time from the present state.

The permissible current calculation unit 303 calculates the permissible current by using (Formula 1) on the basis of the information from the parameter map 302.

[Mathematical Expression 1]

$$I_{Limit} = \frac{V_{Limit} - OCV_0 - V_{P\_0}}{R_{DC} + G_{OCV} + R_P} \quad \text{(Formula 1)}$$

$V_{limit}$ is an upper and lower limit voltage, $OCV_0$ is a present OCV, $V_{P\_0}$ is a present polarization voltage, $R_{DC}$ is a DC resistance corresponding to the resistor 201, $G_{OCV}$ is a value obtained by dividing the OCV amount which changes during n seconds of permissible current application by the current value, and RP is a value obtained by subtracting $R_{DC}$ from the DC resistance value after the current application for n seconds (hereinafter, referred to as polarization resistance at the n-th second). While FIG. 3 is illustrated as if the charging/discharging direction is not taken into consideration, the battery voltage predicting direction after n seconds differs depending on the charging/discharging direction in actual control, and thus, two types of processing are performed separately for charging and discharging.

Figure 5:
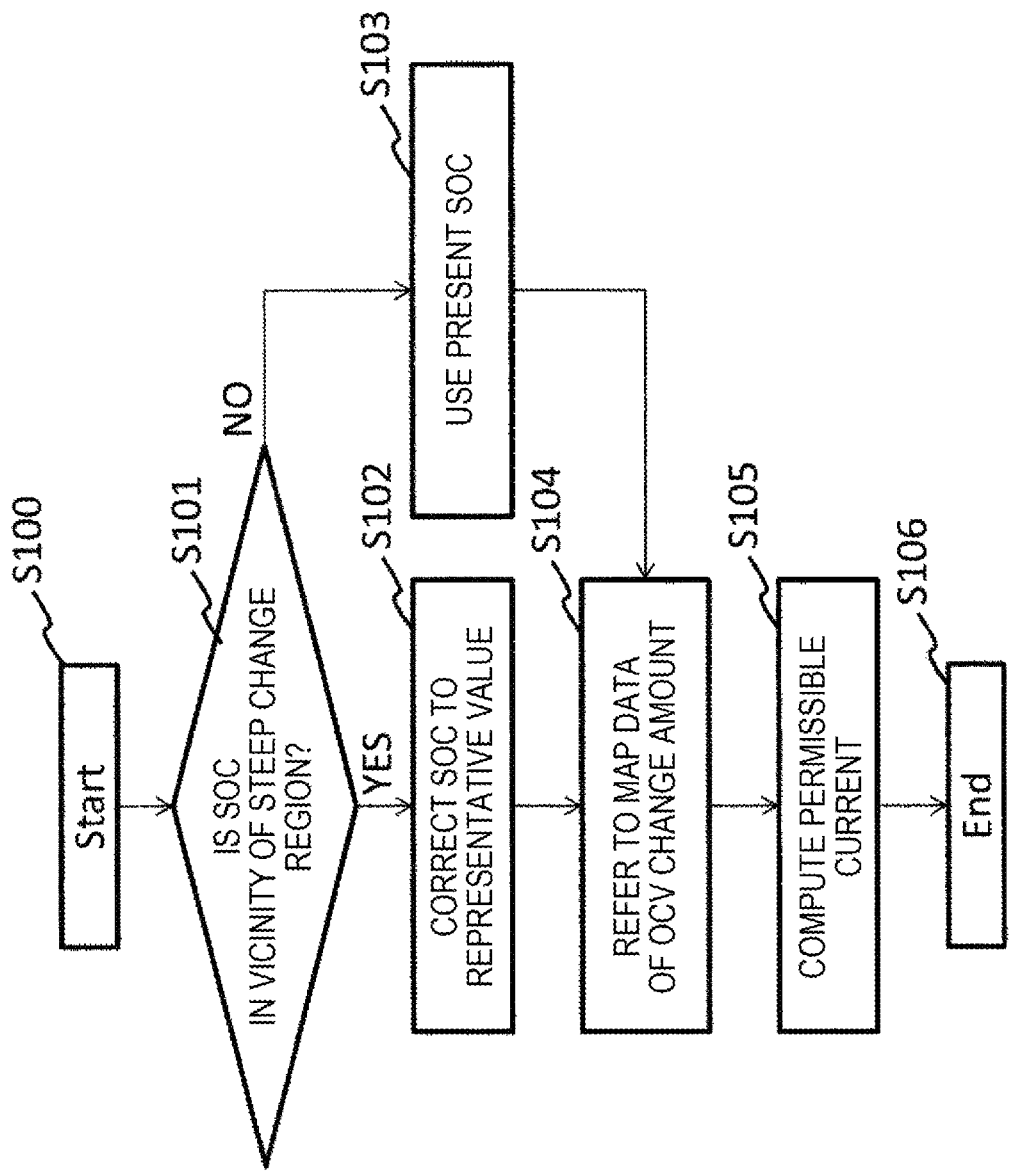
FIG. 5 is a control flow of the present invention.

A specific control flow will be described with reference to FIG. 5. The control flow includes steps S100 to S106. The control flow starts from step S100. Step S100 corresponds to battery information input from the battery equivalent circuit model computation unit 109 to the permissible current computation unit 111. This step receives battery information such as SOC and OCV from the caller of the control flow, and passes the information to step S101.

Step S101 corresponds to the processing in the SOC-OCV steep change region determination unit 300 and determines whether the SOC is in the vicinity of the above-described steep change region. In a case where the SOC is in the vicinity of the steep change region, the processing proceeds to step S102. In a case where the SOC is not in the vicinity of the steep change region, the processing proceeds to step S103.

Step S102 corresponds to the computation in the SOC correction unit 301 and corrects the SOC to the SOC representative value corresponding to the steep change region including the SOC, and the processing proceeds to step S104. The SOC representative value is the SOC value corresponding to the slope representative value (maximum value) of OCV as described above. In the present exemplary embodiment, there are steep change regions 400 and 401 as illustrated in FIG. 4. Since the OCV slope is stored as the map data for every SOC 10%, the permissible current v in the discharge direction of the steep change region 400 is performed such that the SOC of 10 to 20% would be corrected to 20% being a SOC representative value, and SOC of 0 to 10% would be corrected to 10% being a SOC representative value. In contrast, the permissible current computation of the charging direction of the steep change region 401 is performed such that the SOC of 70 to 80% would be corrected to 70% being the SOC representative value. Since the criterion for the representative value and range differs depending on the number of data maps, the required high output and the degree of safety, it is possible to design for each of systems.

Meanwhile, in step S103, the present SOC is selected as it is and the processing proceeds to step S104.

Step S104 corresponds to the computation in the battery characteristic parameter map unit 302 in which an OCV slope representative value from the SOC representative value is referred to from the map data. In a case where the immediately preceding step is step S102, the SOC representative value has been obtained as the SOC, and thus, the representative value of the slope of OCV corresponding to this is referred to. In a case where the immediately preceding step is step S103, the present SOC value has been obtained, and thus, interpolation processing is performed between the map data of the slope of the OCV to obtain the slope of the corresponding OCV.

Finally, the processing proceeds to step S105. Step S105 corresponds to the processing in the permissible current calculation unit 303, and computes the permissible current together with the calculated OCV or OCV slope representative value, and the other values received in step S100. With execution of the processing of dividing by OCV or an OCV slope representative value, it is possible to perform permissible current computation that achieves both high output and safety in both the steep change regions 400 and 401 and the other regions (non-steep change regions 402 and 403).

Moreover, an active material containing graphite or silicon as a main component is used as a negative electrode material used in the battery of the present invention. This is because the material like this has a distinct difference between the steep change region and the non-steep change region and thus easy to control.

The above-described exemplary embodiment will be summarized as below. The battery control device 102 according to the present exemplary embodiment is a device that computes a permissible current of a battery including the battery characteristic non-steep change region 402 having a small change in battery characteristics and the battery characteristic steep change regions 400 and 401 each having a change in battery characteristic greater than the change in the battery characteristic non-steep change region. The battery control device 102 includes the permissible current computation unit 111 that performs, in a case where the battery enters the battery characteristic steep change regions 400 and 401 after a predetermined time from the present state, calculation of a battery characteristic value by using a value greater than an absolute value of the slope of the present battery characteristic, and then, computation of the permissible current by using the obtained battery characteristic value. With such a configuration, even when the battery has an inflection point, that is, a steep change region in a SOC-OCV curve, it is possible to appropriately predict battery information after application of the permissible current without increasing the amount of data to be mounted, leading to achievement of control in the safe direction. Moreover, since there is no need to increase the amount of data unnecessarily, it is possible to mount the battery even in a system with data capacity limitation.

Second Exemplary Embodiment

Next, a second exemplary embodiment will be described. While the first exemplary embodiment considers the influence of the steep change of the slope for the OCV slope alone, the value varying in accordance with the battery state such as the SOC not merely corresponds to the OCV but also a change in the resistance value of the resistor 201 and the polarization resistance of the n-th second. Moreover, the temperature and the current value, as well as SOC, have an influence on the DC resistance or the like. Therefore, in the present exemplary embodiment, a configuration for correcting the temperature and the current as well as for the SOC described in the first exemplary embodiment will be described with reference to FIG. 6. Note that the description already given with reference to FIGS. 1 to 5 will be omitted. The difference between the configuration of the present exemplary embodiment and the configuration of the first exemplary embodiment is that it includes: a battery state steep change region determination unit 500 that determines whether there is a steep change region even for the battery state other than the SOC; and a battery state correction unit 501 that corrects all values of the battery state SOC, the temperature, and the current to their representative values.

Figure 6:
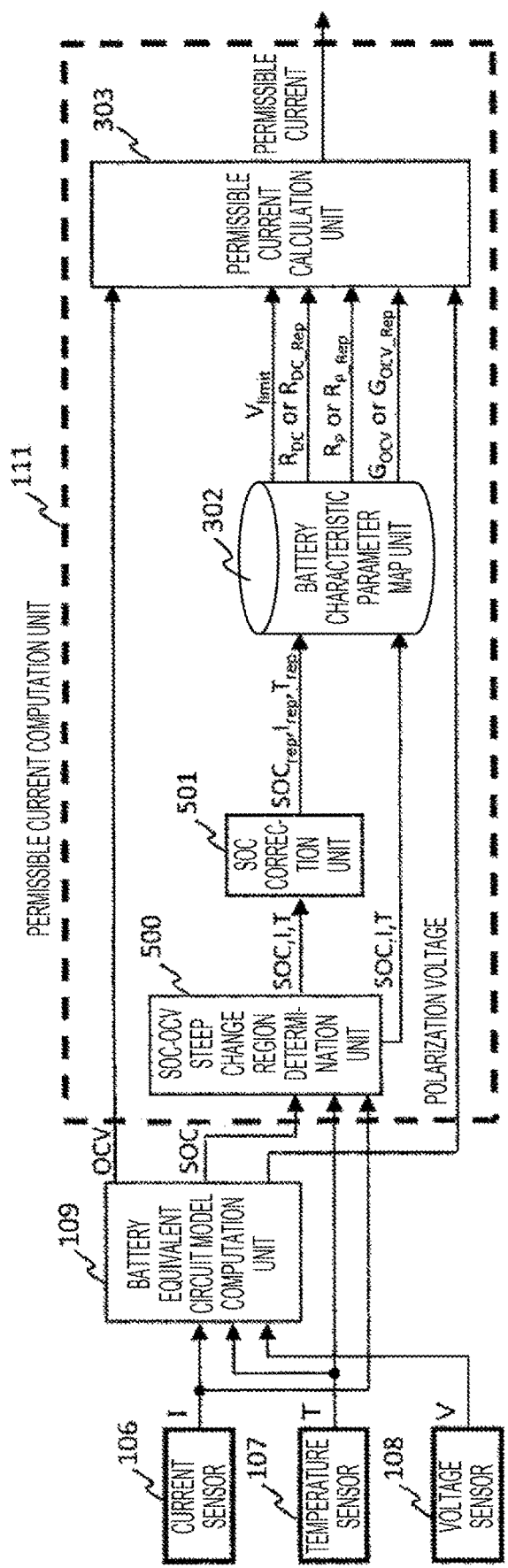
FIG. 6 is an example of a permissible current computation unit corresponding to a battery characteristic steep change region.
Figure 7:
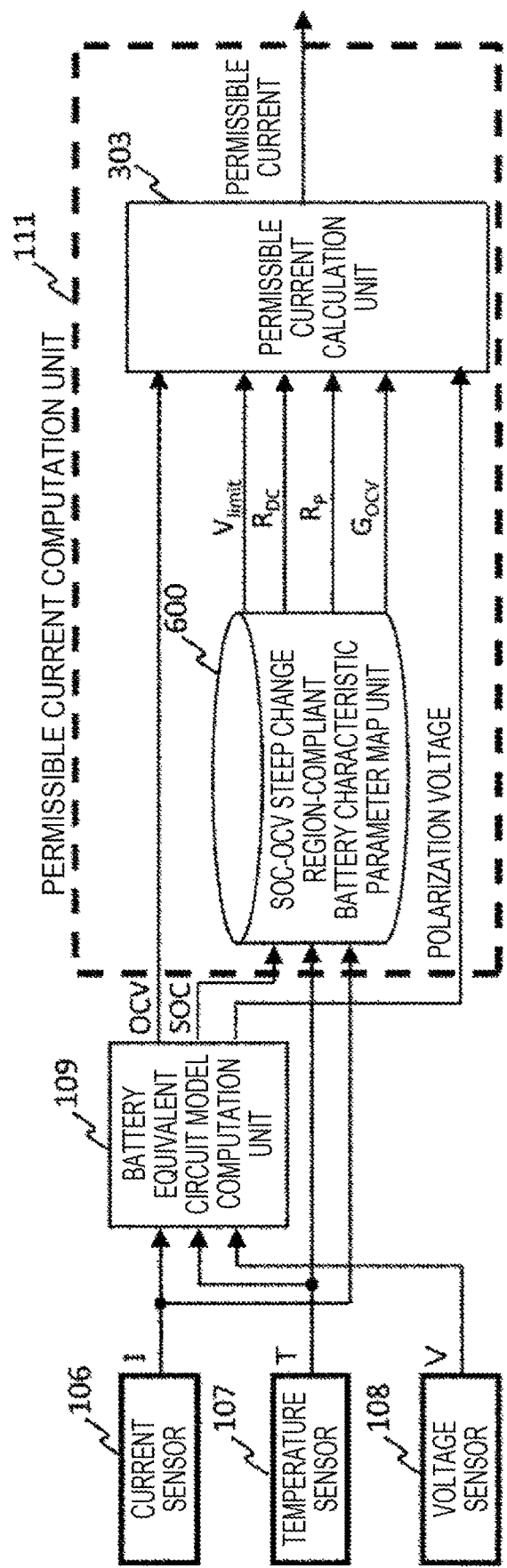
FIG. 7 is an example of a permissible current computation unit included in a battery characteristic steep change region-compliant parameter map.

FIG. 6 illustrates the second exemplary embodiment. Similarly to the SOC-OCV steep change region determination unit 300, the SOC-OCV steep change region determination unit 500 of the present exemplary embodiment determines whether the slope of the OCV, the resistor 201, and the polarization resistance of the n-th second are located in the vicinity of the steep change region exhibiting steep changes on the basis of the SOC, current, and temperature.

Subsequently, the determination result together with the SOC, the current, and the temperature are output to the SOC correction unit 501.

The SOC correction unit 501 corrects the SOC, the current, and the temperature to the representative values corresponding to the OCV slope representative value, the representative value of the resistor 201 and the resistor representative value of the polarization 202 determined in a similar manner, so as to obtain the values referring to the representative values, and outputs the values to the battery characteristic parameter map unit 302.

In this manner, in the present exemplary embodiment, the current and the temperature are also corrected, and representative values are referred to in the case of the resistor 201 and the polarization resistance of the n-th second, it is possible to achieve both safety and output for the value that is likely to have a steep change in the slope, such as SOC-resistance $R_{DC}$ and T-polarization term $R_{DC}$ in addition to SOC-OCV, similarly to the OCV slope of the first exemplary embodiment.

The above-described exemplary embodiment will be summarized as below. In the present exemplary embodiment, the SOC correction unit 501 corrects the SOC, the current, and the temperature to the representative values corresponding to the OCV slope representative value, the representative value of the resistor 201 and the resistor representative value of the polarization 202 determined in a similar manner, so as to obtain the values referring to the representative values, and outputs the values to the battery characteristic parameter map unit 302. Adopting such a configuration makes it possible to achieve both safety and output for the value that is likely to have a steep change in the slope, such as SOC-resistance $R_{DC}$ and T-polarization term $R_{DC}$ in addition to OC-OCV, similarly to the OCV slope of the first exemplary embodiment.

Third Exemplary Embodiment

Next, a third exemplary embodiment will be described. While the first and second exemplary embodiments uses the maximum value of the representative value of the slope of OCV, or the like, it is also possible to use a value being the maximum value or less taking safety into consideration in particular. In other words, the third embodiment differs from the first exemplary embodiment and the second example in that the representative value is set to a value greater than the absolute value of the present OCV slope and set to a value being the maximum value of the slope of OCV in the section, or less. This configuration enables processing in the safe direction without excessively suppressing the permissible current, making it possible to easily maintain the safety of the battery even in a case where the characteristics of the battery change unexpectedly.

The above-described exemplary embodiment will be summarized as below. In the present exemplary embodiment, the representative value of the slope of the OCV or the like is set to be the maximum value of the slope or less and set to a value greater than the absolute value of the present OCV slope. This configuration achieves the permissible current control in which the safety can be improved without excessively suppressing the permissible current.

Fourth Exemplary Embodiment

Next, a fourth exemplary embodiment will be described. In the first to third exemplary embodiments, the slope information is newly introduced as map data. In the present exemplary embodiment, however, map data different from the other sections are used in the vicinity of the steep change region. Details will be described with reference to FIG. 7. Note that descriptions already given with reference to FIGS. 1 to 6 will be omitted. In this configuration, the permissible current computation unit 111 includes a SOC-OCV steep change region-compliant battery characteristic parameter map unit 600 and a permissible current computation unit 303.

The SOC-OCV steep change region-compliant battery characteristic parameter map unit 600 receives battery states from the current sensor 106, the temperature sensor 107, and the battery equivalent circuit model computation unit 109, and outputs a battery upper limit voltage $V_{limit}$, $R_{DC}$, or the like, on the basis of the received battery states. Here, a detailed parameter map having the increased number of data points in the steep change region is introduced into the SOC-OCV steep change region-compliant battery characteristic parameter map unit 600. Introduction of this reduces the error of each of parameters in the vicinity of the steep change region. Although the number of data points may be increased in the whole region, differentiation of the steep change region and the other battery characteristic non-steep change region by the number of data points would make it possible to increase the slope in the steep change region to achieve control in the safety direction while minimizing the increase in the number of data points. Although the increase in the number of data points would be a problem, it is possible to determine a steep change region and achieve safety and high output at the same time even with this configuration.

The above-described exemplary embodiment will be summarized as below. The present exemplary embodiment performs permissible current control by using the previously stored SOC-OCV steep change region-compliant battery characteristic parameter map unit 600, instead of using the slope of the directly measured SOC-OCV steep change region. Adopting such a configuration can suppress incorporating an error included in computing directly measured into the data, making possible to perform accurate permissible current control continuously.

Fifth Exemplary Embodiment

Figure 8:
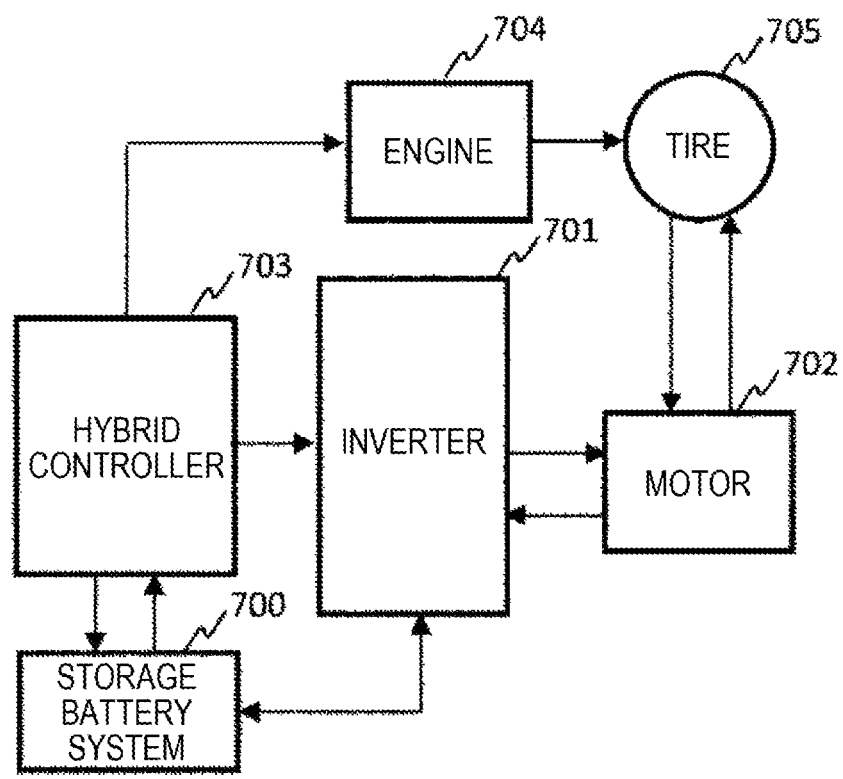
FIG. 8 is a configuration example of a hybrid system of a vehicle.

Finally, a fifth exemplary embodiment will be described. In the present exemplary embodiment, a configuration considering a steep change region of battery characteristics in a hybrid vehicle will be described. A configuration of a hybrid system of a vehicle is illustrated in FIG. 8. The hybrid system of this vehicle includes a battery system 700, an inverter 701, a motor 702, a hybrid controller 703, an engine 704, and a tire 705.

As illustrated in the first exemplary embodiment, the battery system 700 appropriately sends permissible current information or the like to the hybrid controller 703 corresponding to the steep change region. In a case where the tire 705 is driven, the hybrid controller 703 grasps the information from the battery system 700, the state of the engine 704, or the like, determines an output ratio of the engine 703 and the motor 701 so that the necessary driving force can be output from the tire 705, and then, issues an instruction to each of the units. On the basis of the instruction, the battery system 700 supplies power to the inverter 701 and drives the motor 702. Similarly, the engine 704 operates on the basis of the instruction, and drives the tire 705 with the output of the motor 702.

In a case where a kinetic energy is regenerated by using the tire 705 to decelerate the vehicle to allow the energy to be supplied to the battery system 700 via the motor 702, the hybrid controller 703 similarly determines regenerable power from the information or the like of the battery system 700 so as to regenerate power. In this manner, the output ratio of the motor and the engine via the permissible current computed corresponding to the steep change region of the battery characteristic, making it possible to satisfy input/output load requirements while achieving both safety of the battery and high output of the battery, that is, low fuel consumption.

The present invention will be summarized as below. The battery control device 102 according to the present invention is a device that computes permissible current of a battery including the battery characteristic non-steep change region 402 having a small change in battery characteristics and the battery characteristic steep change regions 400 and 401 each having a change in battery characteristic greater than the change in the battery characteristic non-steep change region. The battery control device 102 includes the permissible current computation unit 111 that performs, in a case where the battery enters the battery characteristic steep change regions 400 and 401 after a predetermined time from the present state, calculation of a battery characteristic value by using a value greater than an absolute value of the slope of the present battery characteristic, and then, computation of the permissible current by using the obtained battery characteristic value. With such a configuration, even when the battery has an inflection point, that is, a steep change region in a SOC-OCV curve, it is possible to appropriately predict battery information after application of the permissible current without increasing the amount of data to be mounted, leading to achievement of control in the safe direction. Moreover, since there is no need to increase the amount of data unnecessarily, it is possible to mount the battery even in a system with data capacity limitation.

Moreover, in the battery control device 102 according to the present invention, a value greater than the absolute value of the present battery characteristic slope is the absolute value of the maximum slope in the battery characteristic steep change regions 400 and 401, or less. This configuration achieves the permissible current control in which the safety can be improved without excessively suppressing the permissible current.

Moreover, in the battery control device 102 according to the present invention, a value greater than the absolute value of the present battery characteristic slope is the absolute value of the maximum slope in the battery characteristic steep change regions 400 and 401. Adopting such a configuration makes it possible to perform permissible current control in consideration of the safety to the maximum.

Moreover, the battery control device 102 according to the present invention uses an active material containing graphite or silicon as a main component as a negative electrode material used for the battery. This is because the material like this has a distinct difference between the steep change region and the non-steep change region and thus easy to control.

The battery control device 102 according to the present invention further includes a storage unit that stores map data of the SOC-OCV characteristic. The absolute value of the slope of the present battery characteristic has been calculated from the map data. Adopting such a configuration can suppress incorporating an error included in computing directly measured into the data, making possible to perform accurate permissible current control continuously.

Moreover, a second battery system 1 according to the present invention includes: a battery having the battery characteristic non-steep change region 402 having a small change in battery characteristics and the battery characteristic steep change regions 400 and 401 each having a change in battery characteristic greater than the change in the battery characteristic non-steep change region 402; and the battery control device 102 that computes permissible current of the battery. The battery control device 102 includes the permissible current computation unit 111 that performs, in a case where the battery enters the battery characteristic steep change regions 400 and 401 after a predetermined time from the present state, calculation of a battery characteristic value by using a value greater than an absolute value of the slope of the present battery characteristic, and then, computation of the permissible current by using the obtained battery characteristic value.

Moreover, a vehicle according to the present invention includes: the motor 702 electrically connected with a battery having the battery characteristic non-steep change region 402 having a small change in battery characteristics and the battery characteristic steep change regions 400 and 401 each having a change in battery characteristic greater than the change in the battery characteristic non-steep change region 402; the engine 704; and a vehicle control device 703 that computes an output ratio of the engine 704 and the motor 702. The vehicle control device includes the output ratio computation unit that performs, in a case where the battery enters the battery characteristic steep change regions 400 and 401 after a predetermined time from the present state, calculation of a battery characteristic value by using a value greater than an absolute value of the slope of the present battery characteristic, and then, computation of the output ratio of the engine 704 and the motor 702 by using the obtained battery characteristic value. Adopting such a configuration makes it possible to satisfy input/output load requirements while achieving both safety of the battery and high output of the battery, that is, low fuel consumption.

As above, embodiments of the present invention have been described. The present invention is not limited to the above-described embodiments but may include various design modifications without departing from the spirit of the present invention described in claims. For example, the above-described embodiments give detailed explanation just to allow the present invention to be clearly understood. Therefore, the present invention is not limited to the case having all of components in the configuration. In addition, a part of configuration of an embodiment can be replaced with a part of configuration of another embodiment. A part or the configuration of another embodiment can be added to a certain embodiment. Furthermore, it is possible to modify a portion of the configuration of each of the embodiments, such as addition, deletion, and replacement from another configuration.

REFERENCE SIGNS LIST

100 battery module
101 battery information acquisition unit
102 battery control device
103 host controller
104 inverter
105 load
106 current sensor
107 temperature sensor
108 voltage sensor
109 battery equivalent circuit model computation unit 110 battery SOH computation unit
111 permissible current computation unit
200 OCV
201 DC resistance
202 polarization term
203 polarization resistance
204 polarization capacitor
300 SOC-OCV steep change region determination unit
301 SOC correction unit
302 battery parameter map unit
303 permissible current calculation unit
400 steep change region 1
401 steep change region 2
500 battery state steep change region determination unit
501 battery state correction unit
600 battery characteristic steep change region-compliant battery characteristic parameter map unit
700 battery system
701 inverter
702 motor
703 hybrid controller
704 engine
705 input/output requirement

The invention claimed is:

1. A battery control device that computes a permissible current of a battery including a battery characteristic non-steep change region having a small change in a battery characteristic and a battery characteristic steep change region having a change in the battery characteristic greater than the change in the battery characteristic non-steep change region, the battery control device comprising:
a permissible current computation unit that performs, in a case where the battery enters the battery characteristic steep change region after a predetermined time from a present state, calculation of a representative battery characteristic value using a value greater than an absolute value of a slope of a present battery characteristic, and then computation of the permissible current using the obtained representative battery characteristic value.

2. The battery control device according to claim 1, wherein the value greater than the absolute value of the slope of the present battery characteristic is an absolute value of the maximum slope in the battery characteristic steep change region, or less.

3. The battery control device according to claim 2, wherein the value greater than the absolute value of the slope of the present battery characteristic is an absolute value of the maximum slope in the battery characteristic steep change region.

4. The battery control device according to claim 2, wherein the battery characteristic is an SOC-OCV characteristic.

5. The battery control device according to claim 4, wherein an active material containing graphite or silicon as a main component is used as a negative electrode material used for the battery.

6. The battery control device according to claim 4, further comprising a storage unit, wherein the storage unit stores map data of an SOC-OCV characteristic, and the absolute value of the slope of the present battery characteristic has been calculated from the map data.

7. A battery system comprising:
a battery including a battery characteristic non-steep change region having a small change in a battery characteristic and a battery characteristic steep change region having a change in the battery characteristic greater than the change in the battery characteristic non-steep change region; and
a battery control device configured to compute a permissible current of the battery,
wherein the battery control device includes a permissible current computation unit configured to perform, in a case where the battery enters the battery characteristic steep change region after a predetermined time from a present state, calculation of a representative battery characteristic value using a value greater than an absolute value of a slope of a present battery characteristic, and then computation of the permissible current using the obtained representative battery characteristic value.

8. A vehicle comprising:
a battery having a battery characteristic non-steep change region having a small change in a battery characteristic and a battery characteristic steep change region having a change in the battery characteristic greater than the change in the battery characteristic non-steep change region;
a motor electrically connected with the battery;
an engine; and
a vehicle control device that computes an output ratio of the engine and the motor,
wherein the vehicle control device includes an output ratio computation unit that performs, in a case where the battery enters the battery characteristic steep change region after a predetermined time from a present state, computation of a battery characteristic value using a value greater than an absolute value of the slope of a present battery characteristic, and then computation of the output ratio of the engine and the motor using the obtained battery characteristic value.

9. The battery control device according to claim 2, wherein the permissible current is equal to or less than a maximum chargeable/dischargeable current such that a voltage of the battery does not exceed an upper voltage limit and a lower voltage limit set to prevent battery deterioration and uncontrollable operation.

10. The battery control device according to claim 2, wherein the battery characteristic further comprises at least one of a SOC-OCV characteristic, a SOC-resistance characteristic, or a temperature-polarization resistance characteristic.

11. The battery control device according to claim 10, wherein the permissible current is equal to or less than a maximum chargeable/dischargeable current such that a voltage of the battery does not exceed an upper voltage limit and a lower voltage limit set to prevent battery deterioration and uncontrollable operation.

12. The battery system according to claim 7, wherein the permissible current is equal to or less than a maximum chargeable/dischargeable current such that a voltage of the battery system does not exceed an upper voltage limit and a lower voltage limit set to prevent battery deterioration and uncontrollable operation.

* * * * *